United States Patent
Krishnan et al.

(10) Patent No.: US 6,204,138 B1
(45) Date of Patent: Mar. 20, 2001

(54) METHOD FOR FABRICATING A MOSFET DEVICE STRUCTURE WHICH FACILITATES MITIGATION OF JUNCTION CAPACITANCE AND FLOATING BODY EFFECTS

(75) Inventors: Srinath Krishnan, Campbell; Witold P. Maszara, Morgan Hill; Ming-Ren Lin, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/260,821

(22) Filed: Mar. 2, 1999

(51) Int. Cl.[7] .................................................. H01L 21/336
(52) U.S. Cl. ........................ 438/307; 438/305; 438/151
(58) Field of Search ................................. 438/199, 301, 438/303, 305, 307, 231; 436/199, 301, 303, 305, 307, 231

(56) References Cited

U.S. PATENT DOCUMENTS

| 5,171,700 | * | 12/1992 | Zamanian | 437/44 |
| 5,654,215 | * | 8/1997 | Gardner et al. | 438/286 |
| 5,726,081 |   | 3/1998 | Lin et al. . | |
| 5,736,435 |   | 4/1998 | Venkatesan et al. . | |
| 5,767,549 |   | 6/1998 | Chen et al. . | |
| 5,770,881 |   | 6/1998 | Pelella et al. . | |
| 5,774,411 |   | 6/1998 | Hsieh et al. . | |
| 5,776,806 | * | 7/1998 | Dennison et al. | 438/199 |
| 5,821,575 |   | 10/1998 | Mistry et al. . | |
| 6,004,854 | * | 12/1999 | Dennison et al. | 438/306 |
| 6,025,239 | * | 2/2000 | Yu | 438/302 |
| 6,060,364 | * | 5/2000 | Maszara | 438/305 |

OTHER PUBLICATIONS

*Microwave Journal,* "An Ultra–Thin Silicon Technology That Provides Integration Solutions on Standard CMOS", Peregrine Semiconductor Corp., Jan. 1998, pp. 201–204.
*Solid State Technology,* "SIMOX Silicon–on–Insulator: Materials and Devices", Harold H. Hosack, et al., Dec. 1990, pp. 61–66.
Pye, Fry, and Schaffer: *Solid State Technologies,* "High-–Density Plasma CVD and CMP for 0.25-um Intermetal Dielectric Processing"; Dec. 1995; p 65–71.

* cited by examiner

Primary Examiner—Vu A. Le
Assistant Examiner—Brad Smith
(74) Attorney, Agent, or Firm—Amin, Eschweiler & Turocy, LLP (57) ABSTRACT

A method of forming a MOSFET device is provided. First lightly doped regions are formed, the first lightly doped regions including LDD extension regions of the device. Second very lightly doped regions are formed at least partially below the first lightly doped regions, respectively, the second very lightly doped regions having a dopant concentration less than the first lightly doped regions, and the second very lightly doped regions being implanted at a higher energy level than the first lightly doped regions.

19 Claims, 6 Drawing Sheets

METHOD FOR FABRICATING A MOSFET DEVICE STRUCTURE WHICH FACILITATES MITIGATION OF JUNCTION CAPACITANCE AND FLOATING BODY EFFECTS

FIELD OF THE INVENTION

The present invention generally relates to the design of field effect transistors (FETS) and, more particularly, to a metal oxide silicon (MOS) transistor structure which facilitates mitigation of junction capacitance and/or floating body effects.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

An SOI field effect transistor combines two separated immunity groups, generally formed by implantation, constituting the source and drain of the transistor with the general region (device body) between them covered by a thin gate insulator and a conductive gate. Typically no electrical connection is made to the channel region and therefore the body is electrically floating. Because the source and drain regions normally extend entirely through the thin silicon layer, the electrical potential of the body is governed by Kirchoff's current law, wherein the sum of the currents flowing into the body equals the sum of the currents flowing out of the body. Because the channel potential is dependent on the body voltage, the device threshold voltage varies as a function of the body voltage.

The boundaries between the channel region and the source and drain, respectively, form junctions which are normally reversed biased. Conduction in the channel region normally occurs immediately below the gate insulator in the region in which depletion can be controlled by a gate voltage. However, the junctions at the boundary of the source and drain also form a parasitic lateral bipolar transistor, which, in effect exists somewhat below the field effect transistor and may supplement desired channel current. On the other hand, the parasitic bipolar device cannot be controlled and under some bias conditions, the operation of the parasitic bipolar device may transiently dominate the operation of the field effect transistor and effectively occupy substantially the entire silicon layer at times when the channel current is not desired.

When the device is switching, the body is coupled to various terminals of the device because there are capacitances between the body and gate, body and source, and body and drain respectively. When the voltage at the various terminal changes, the body voltage changes as a function of time which in turn effects the device threshold voltage. In certain cases, this relationship may be harmful to a device (e.g., inverter). For example, when the gate of an inverter is switched on the drain is discharged (which is typically the output of the inverter)—thus the drain voltage falls when the gate is switched ON. Because the drain and body are capacitively coupled, when the drain voltage drops so does the body voltage. There is an inverse relationship between the body voltage and the threshold voltage. For an NMOS device, when the body voltage falls, the device threshold voltage increases. When the body voltage increases the threshold voltage decreases. Thus, the capacitive coupling between the drain and the body results in the device losing drive current as the device is being switched.

In SOI transistors there is a lack of a bulk silicon or body contact to the MOS transistor. In some devices, it is desirable to connect the p-type conductivity body in the case of an n-channel MOSFET, or the n-type conductivity body in the case of a p-channel MOSFET, to a fixed potential. This prevents various hysteresis effects associated with having the body potential "float" relative to ground. With bulk silicon MOSFETs such is relatively easy because the bottom of the bulk silicon can be easily electrically connected to a fixed potential.

SOI devices also exhibit a kink effect which originates from impact ionization. When an SOI MOSFET is operated at a relatively large drain-to-source voltage, channel electrons with sufficient energy cause impact ionization near the drain end of the channel. The generated holes build up in the body of the device, thereby raising the body potential. The increased body potential reduces the threshold voltage of the MOSFET. This increases the MOSFET current and causes the so-called "kink" in SOI MOSFET current vs. voltage (I–V) curves.

With regard to the lateral bipolar action, if the impact ionization results in a large number of holes, the body bias may be raised sufficiently so that the source region to body p-n junction is forward biased. The resulting emission of minority carriers into the body causes a parasitic npn bipolar transistor between source, body and drain to turn on, leading to loss of gate control over the MOSFET current.

In view of the above, it is apparent that there is a need in the art for a device which mitigates some of the negative effects mentioned above, relating to junction capacitance and floating body effects.

SUMMARY OF THE INVENTION

The present invention provides for a novel MOSFET device and method for making the same. The device of the present invention mitigates some of the aforementioned problems associated with MOSFET devices. The device of the present invention includes typical first lightly doped source and drain regions (LDD regions). The device also includes second very lightly doped regions below the LDD regions. The second very lightly doped regions facilitate mitigating capacitive coupling between the drain and body which results in improved AC/dynamic performance (e.g., speed) of the device as compared to devices having higher junction capacitances. More particularly, the device structure mitigates dropping of body potential during device switching by lowering the capacitive coupling between the drain and the body. As mentioned above, the body potential and threshold potential are inversely related and by reducing capacitive coupling between the drain and body dropping of body voltage during switching is mitigated. This in turn mitigates variances in the threshold voltage.

The second very lightly doped regions also facilitate mitigating recombination of excess carriers which reduces device hysteresis (minimizing hysteretic effects is desired in applications where variation in threshold voltage is not tolerated). More particularly, since the device may be charged and discharged, the device threshold voltage changes as a function of time. The structure of the present invention increases the rate at which the body can be charged and/or discharged. The second very lightly doped region facilitates the rate of removal of excess carriers (increasing the recombination of the body/source junction by providing a smaller barrier for holes to be removed from the body). In other words, the second very lightly doped region increases the current exiting the body which results in mitigating body potential variation, and mitigating hysteretic effects.

The second very lightly doped regions also increase the distance between the source and drain from the body respectively, which mitigate short channel effects. This aspect of the invention can be applied to both SOI and bulk.

One aspect of the invention relates to a MOSFET device. The device includes: a source region; a drain region; first lightly doped regions, the first lightly doped regions including a lightly doped source extension region and a lightly doped drain extension region. The device further includes second very lightly doped regions, the second very lightly doped regions including two regions, one of the regions residing below at least a portion of the lightly doped source extension region, and the other of the second very lightly doped regions residing below at least a portion of the lightly doped drain extension region.

Another aspect of the device relates to a transistor structure which includes: a source region, including an $N^+$ source region; an $N^-$ lightly doped source region, and an $N^{--}$ lightly doped source region, the $N^{--}$ lightly doped source region residing below at least a portion of the $N^-$ lightly doped source region and adjacent at least a portion of the $N^+$ source region. The structure also includes a drain region, including an $N^+$ drain region; an $N^-$ lightly doped drain region, and an $N^{--}$ lightly doped drain region, the $N^{--}$ drain region residing below at least a portion of the $N^-$ lightly doped drain region and adjacent at least a portion of the $N^+$ drain region; and a $P^+$ body region residing below a gate of the device and between the source and drain regions. The $N^{--}$ drain regions facilitates mitigation of junction capacitance.

Yet another aspect of the device relates to an SOI NMOS device including: a silicon substrate; an insulating oxide layer formed over the substrate; and a top silicon layer formed over the insulating oxide layer. The device further includes: a gate formed over a portion of the top silicon layer; a gate oxide formed between the gate and the top silicon layer; $N^+$ source and $N^+$ drain regions formed in the top silicon layer; $N^-$ lightly doped source and drain extension regions formed in the top silicon layer; and $N^{--}$ lightly doped source and drain regions, the $N^{--}$ regions having lower dopant concentration than the $N^-$ regions, respectively, the $N^{--}$ regions residing below at least portions of the $N^-$ regions, respectively. The $N^{--}$ regions facilitate mitigating junction capacitance and mitigating floating body effects and short channel effects.

Still another aspect of the invention relates to a method of forming a MOSFET device. In the method, first lightly doped regions are formed, the first lightly doped regions including LDD extension regions of the device. Second very lightly doped regions at least partially below the first lightly doped regions, respectively, are formed. The second very lightly doped regions have a dopant concentration less than the first lightly doped regions, and the second very lightly doped regions are implanted at a higher energy level than the first lightly doped regions.

Another aspect of the present invention relates to a method of forming an SOI NMOS transistor, comprising the steps of: using a SIMOX process to form a silicon base, an oxide layer between the base and a top silicon layer; a silicon substrate; and an insulating oxide layer formed over the substrate. $N^+$ source and $N^+$ drain regions are formed in the top silicon layer. $N^-$ lightly doped source and drain extension regions are formed in the top silicon layer. $N^{--}$ lightly doped source and drain regions are also formed, the $N^{--}$ regions having lower dopant concentration than the $N^-$ regions, respectively, the $N^{--}$ regions residing below at least portions of the $N^-$ regions, respectively; wherein the $N^{--}$ regions facilitate mitigating junction capacitance and mitigating floating body effects and short channel effects.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention relates to a MOSFET device structure which facilitates mitigation of junction capacitance and/or floating body effects, and a method for making the same. The MOSFET device of the present invention exhibits faster performance, lower power consumption and less device hysteresis than many conventional MOSFET devices. The present invention will now be described with reference to the drawings, wherein like reference numerals are used to refer to like elements throughout. Although the present invention is described primarily in connection with an SOI MOSFET device structure, the present invention may be employed in connection with bulk MOSFET device structures as well. The following detailed description is of the best mode presently contemplated by the inventors for practicing the invention. It should be understood that the description of this preferred embodiment is merely illustrative and that it should not be taken in a limiting sense.

Figure 1A:
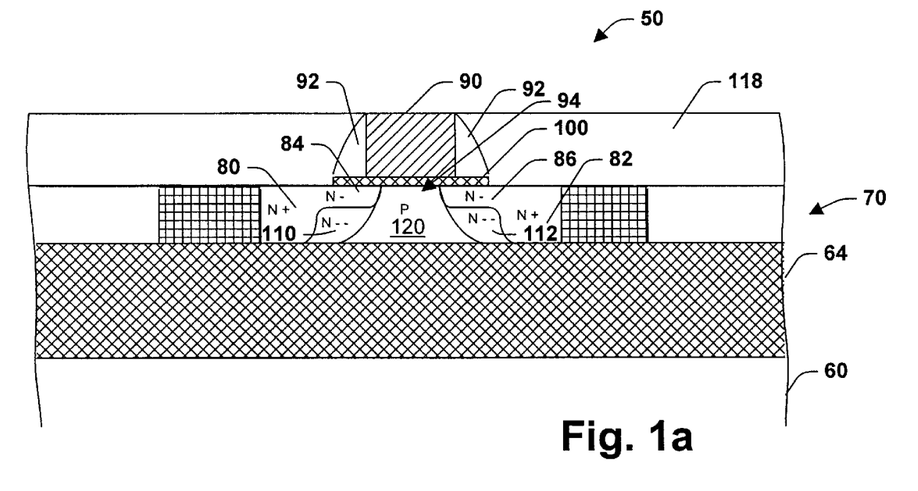
FIG. 1a is a schematic cross-sectional illustration of an NMOS SOI structure in accordance with the present invention.

FIG. 1a is a schematic cross-sectional illustration of an SOI MOSFET device structure 50 in accordance with the present invention. The device structure 50 includes a base 60 comprising silicon, for example. The base 60 provides mechanical support for the device structure 50, and is of a thickness suitable for providing such support. A dielectric layer 64 (e.g., $SiO_2$, $Si_3N_4$) is formed over the base 60. The thickness of the dielectric layer 64 is preferably within the range of 1000 Å to 5000 Å. A top silicon layer 70 is shown formed over the dielectric layer 64, and the top silicon layer preferably has a thickness within the range of 500 Å to 2000 Å. The top silicon layer 70 becomes the active region for device fabrication.

The device structure 50 is an NMOS type device and further includes an $N^+$ drain region 80, an $N^+$ source region 82, an $N^-$ lightly doped drain extension region 84, and an $N^-$ lightly doped source extension region 86. The lightly doped source/drain extension regions 84, 86 may be referred to herein as first light doped regions. The device structure 50 includes a gate 90 (formed between two sidewall spacers 92) and p-type channel 94, and a gate oxide layer 100 formed between the gate 90 and the channel 94. An oxide layer 118 serves to protect the device 50 from contaminants, etc.

Under the lightly doped source and drain extension regions 84, 86, respectively, are second very lightly doped regions 110 and 112. The area under the channel 94 and between the source/drain extension regions 84, 86 and second very lightly doped regions 110, 112 is a p-type body 120. As noted above, the second very lightly doped regions 110, 112 facilitate capacitive decoupling of the drain/body junction and source/body junction. The second very lightly doped regions 110, 112 also facilitate mitigating floating body effects (e.g., kink effect and hysteresis effects) of the device 50. Lowering the doping concentration of the source/drain regions reduces the junction capacitances between the drain/body and source/body interfaces. The junction capacitance is related to the doping concentrations of the regions forming the junction, as can be seen from the following formula:

$$C_j = \epsilon A[(q/2\epsilon(V_o-V))(N_a N_d/(N_a+N_d))]^{1/2}$$

wherein A represents the cross sectional area of the source/body and drain/body interfaces, $N_d$ represents the number of donors in the source and drain regions, respectively, and $N_a$ represents the number of acceptors in the body.

The second very lightly doped regions are doped with an $N^-$ type dopant (e.g., P, Ar) and at a dopant concentration less than the $N^-$ dopant concentration of the lightly doped source/drain extension regions 84, 86. The second very lightly doped regions 84, 86 have a higher dopant concentration than the $P^+$ dopant concentration of the body 120. As a result, the second very lightly doped regions 84, 86 facilitate the rate of removal of excess carriers (increasing the recombination of the body/source junction by providing a smaller barrier for holes to be removed from the body 120). The second very lightly doped regions 84, 86 also increase the distance between the drain 80 and source regions 82 from the body 120, which mitigates short channel effects.

In one specific embodiment of the present invention, the lightly doped source/drain extension regions include an arsenic implant having a dose concentration in the range of $1 \times 10^{14}$ to $1 \times 10^{16}$ atoms/$cm^2$ and implanted at an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention. The second very lightly doped regions 84, 86 preferably include a phosphorus implant having a dose within the range of $1\times10^{12}$ to $1\times10^{14}$ atoms/cm$^2$ and implanted at an energy level within the range of 50 KeV to about 200 KeV. The dose should be just adequate to compensate fir the p-type body region under the LDD. The p-type body 120 includes a P$^+$ implant (e.g., boron) having a dose within the range of $1\times10^{10}$ to $1\times10^{14}$ atoms/cm$^2$.

Figure 1B:
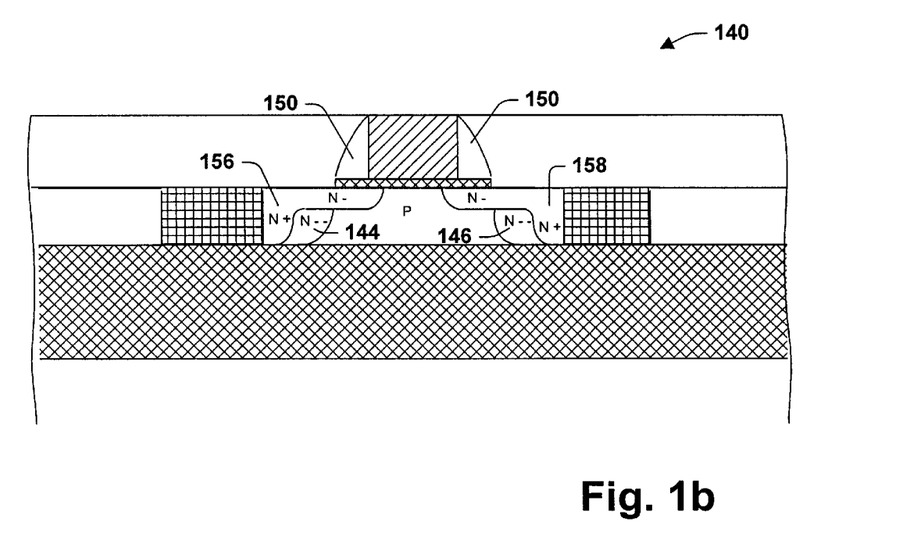
FIG. 1b is a schematic cross-sectional illustration of another NMOS SOI structure in accordance with the present invention.

FIG. 1*b* illustrates another embodiment of the present invention, which provides for an SOI MOSFET structure 140. The structure 140 is substantially similar to the structure 50 and therefore redundant aspects of the two structures are not discussed for sake of brevity. The structure 140 includes second very lightly doped regions 144 and 146 which are located outside of an area below sidewall spacers 150. As a result, drain 156 and source 158 regions of the structure 140 are further away from a channel region 160 of the structure 140 as compared to the structure 50 to provide enhanced mitigation of short channel effects.

Figure 2:
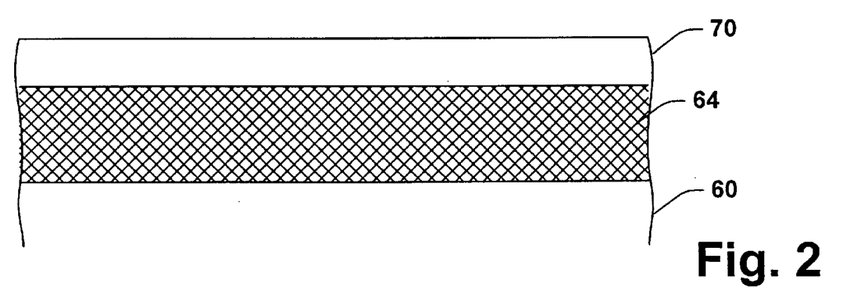
FIG. 2 is a schematic cross-sectional illustration of an SOI substrate in accordance with the present invention.

Turning now to FIGS. 2–18, fabrication steps in connection with forming the structure 50 of FIG. 1*a* are discussed. FIG. 2 illustrates a basic SOI structure in its early stages of fabrication. The structure includes the silicon base 60, the silicon oxide layer 64 and the top silicon layer 70. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of SiO$_2$. Sometimes, epitaxial silicon may be grown atop the silicon to satisfy specific device requirements, but with or without an epitaxial layer, the top surface film 70 becomes the active region for device fabrication. The buried oxide layer 64 is typically 0.1 to 0.5 $\mu$m thick and exhibit almost complete incorporation of the implanted oxygen. Typical implant energies range from 150 to 200 keV, while the oxygen dose may vary from 1 to 2E18 cm$^{-2}$. The top silicon film 70 thickness as well as the variation thereof with respect to the oxide layer 64 thickness is a function of the implant energy as well as the rate of surface silicon sputtering during the implant process.

A second significant step in the SIMOX process is high temperature annealing. Such annealing is typically performed at temperatures greater than 1250° C. for several hours to coalesce the implanted oxygen and achieve solid state recrystallization of the top (superficial) silicon layer 70 from the surface downward.

FIGS. 3–9 illustrate process steps associated with fabrication of isolation regions of the MOSFET device 50 (FIG. 1*a*) in accordance with the present invention. The present process relates to shallow trench isolation (STI), which involves etching a trench into the top silicon layer 70 and filling the trench with an isolation material. Local oxidation of silicon (LOCOS) isolation processes generally occupy a great deal of wafer surface area, and thus STI provides for an alternative isolation technique.

Figure 3:
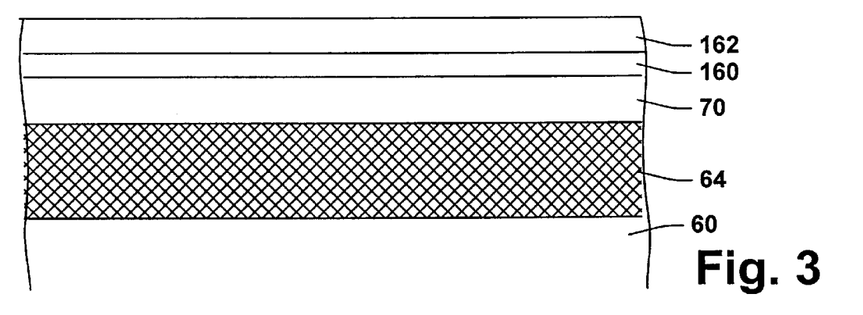
FIG. 3 is a schematic cross-sectional illustration of the SOI substrate of FIG. 2 with a pad oxide layer and nitride layer formed thereon in accordance with the present invention.
Figure 4:
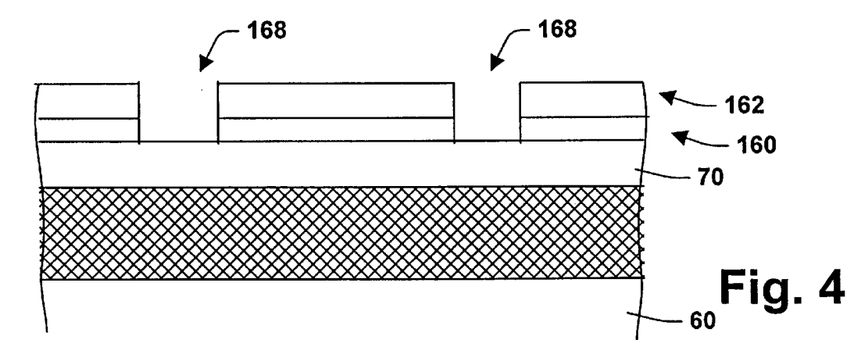
FIG. 4 is a schematic cross-sectional illustration of the structure of FIG. 3 with isolation regions formed therein in accordance with the present invention.

FIG. 3 illustrates a pad oxide layer 160 and a layer of nitride 162 formed on the surface of the top silicon layer 70. The pad oxide layer 160 has a thickness of approximately 200 Å and may be thermally grown at a temperature of approximately 900° C. for a period of 40 minutes. The nitride layer 162 is deposited on the surface of the pad oxide layer 160 via a chemical vapor deposition (CVD) process to a thickness of approximately 2000 Å. A conventional photoresist process is then utilized to pattern and etch the nitride layer 162 and the pad oxide layer 160 in order to result in the structure shown in FIG. 4. Such photoresist process includes use of an STI mask which defines isolation regions 168. The isolation regions 24 are located on the substrate 12 at positions which will interpose active regions later formed on the top silicon layer 70.

Figure 5:
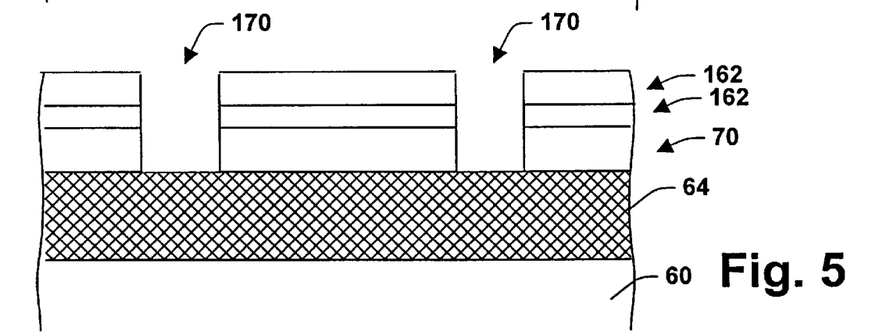
FIG. 5 is a schematic cross-sectional illustration of the structure of FIG. 4 with shallow isolation trenches formed at the isolation regions in accordance with the present invention.

Next, as represented in FIG. 5, a silicon etch is performed so as to form shallow trenches 170 within the top silicon layer 70 at the isolation regions 168. In particular, a trench resist material (not shown) is applied to cover the structure and is then patterned to expose the isolation regions 168. The shallow trenches 170 are then etched into the top silicon layer 70 using suitable techniques. The trench resist material is thereafter stripped so as to result in the structure shown in FIG. 5.

Figure 6:
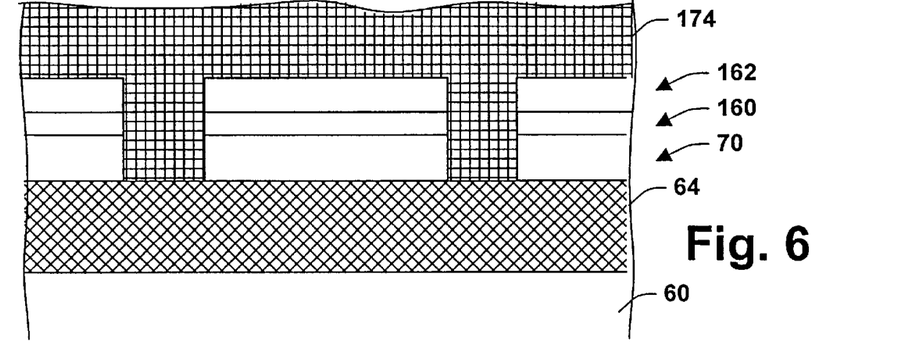
FIG. 6 is a schematic cross-sectional illustration of the structure of FIG. 5 with an oxide layer formed thereon so as to fill the isolation trenches in accordance with the present invention.
Figure 7:
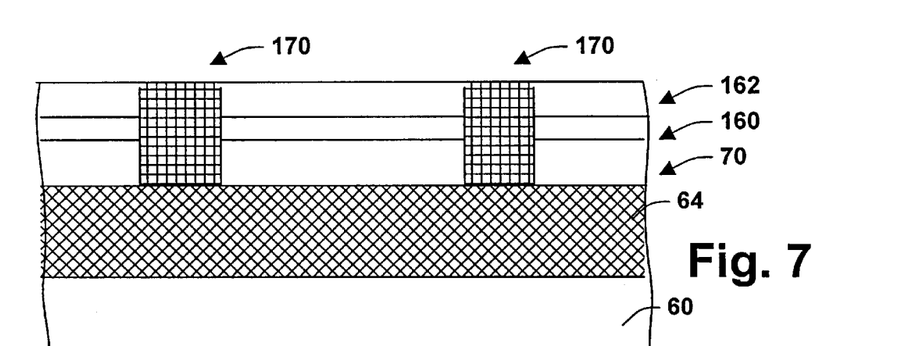
FIG. 7 is a schematic cross-sectional illustration of the structure of FIG. 6 after the oxide layer has been polished down to the surface of the nitride layer in accordance with the present invention.

Following the formation of the trenches 170 via the silicon etch, a layer of oxide material 174 is formed on the structure using high density plasma chemical vapor deposition (HDPCVD) in order to fill fully the isolation regions 170 with the oxide material 174 as shown in FIG. 6. As is known, HDPCVD is a self-planarizing process which facilitates reduction of the chemical mechanical polishing (CMP) times required in subsequent steps. (See, e.g., Pye, J. T. et al, *High-density plasma CVD and CMP for 0.25-μm intermetal dielectric processing,* Solid State Technology, December 1995, pgs. 65–71). Following deposition of the oxide material 174, the oxide material 174 is polished via CMP down to the surface level of the nitride layer 162 as shown in FIG. 7. Consequently, the insulative oxide material 174 in the trenches 170 remains. The upper surface of the oxide material 174 is substantially even with the upper surface of the nitride layer 162.

Figure 8:
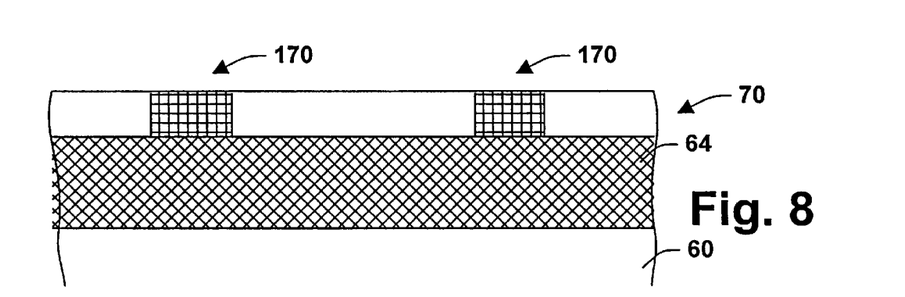
FIG. 8 is a schematic cross-sectional illustration of the structure of FIG. 7 after the nitride layer, pad oxide layer and portions of the oxide layer have been etched away in accordance with the present invention.

As is represented in FIG. 8, the nitride layer 162 and pad oxide layer 160 are stripped away using a suitable stripping process. The strip process also results in the top surface of the oxide material 174 being etched to a level substantially even with the surface of the top silicon layer 70. Thus, the formation of the shallow isolation trenches 170 is substantially complete in relevant part.

Turning now to FIGS. 9–18, process steps in connection with completion of the MOSFET device 50 in accordance with the present invention are described. Although the present invention is described in the context of fabricating an NMOS type device it is to be appreciated that the present invention as applicability to a variety of transistor devices. The present description will enable those skilled in the art to practice the invention with respect to a vast number of different types of transistor devices which are intended to fall within the scope of the invention as defined by the hereto appended claims.

Figure 9:
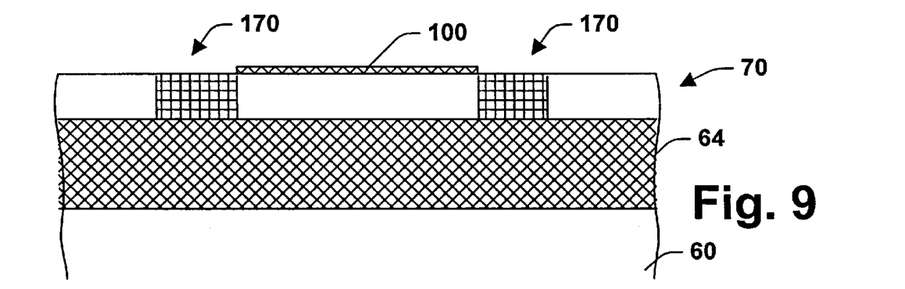
FIG. 9 is a schematic cross-sectional illustration of the structure of FIG. 8 with a thin low dielectric constant gate oxide material formed on the substrate surface between the isolation trenches in accordance with the present invention.
Figure 10:
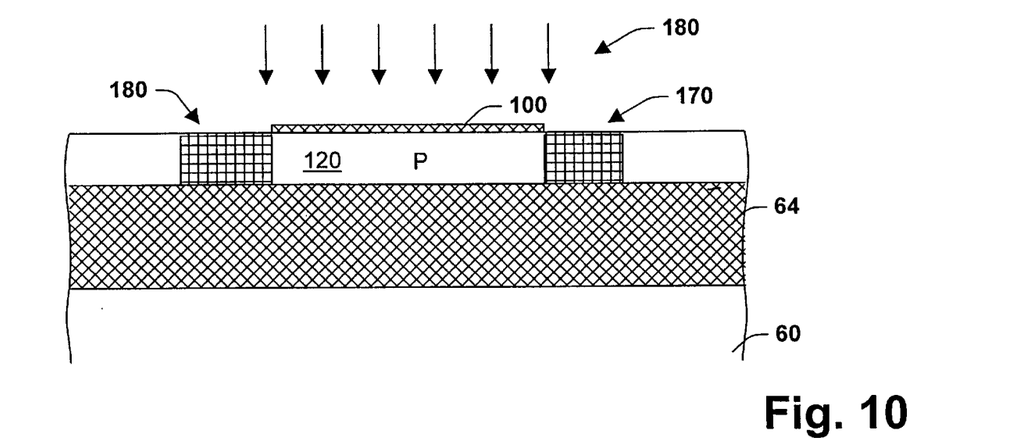
FIG. 10 is a schematic cross-sectional illustration of the structure of FIG. 9 undergoing an ion implant step to form a p-type body region in accordance with the present invention.

FIG. 9 illustrates the thin gate oxide material 100 (FIG. 1*a*) being laid down on the top silicon layer 70 between the shallow trenches 170. The thin gate oxide material 100 is formed to have a thickness within the range of about <40 Å. Preferably, the thin gate oxide material 100 includes SiO$_2$ which has a substantially low dielectric constant. However, it is to be appreciated that any suitable material (e.g., Si$_3$N$_4$) for carrying out the present invention may be employed and is intended to fall within the scope of the present invention. The top silicon layer 70 is of a p-type and the trenches 170 serve as isolation barriers to define active regions. FIG. 10 shows the formation of the p-type body 120 by masking a portion of the top silicon layer 70 with a photoresist layer (not shown) and implanting p-well dopants 180 to provide the p-type body 120.

Figure 11:
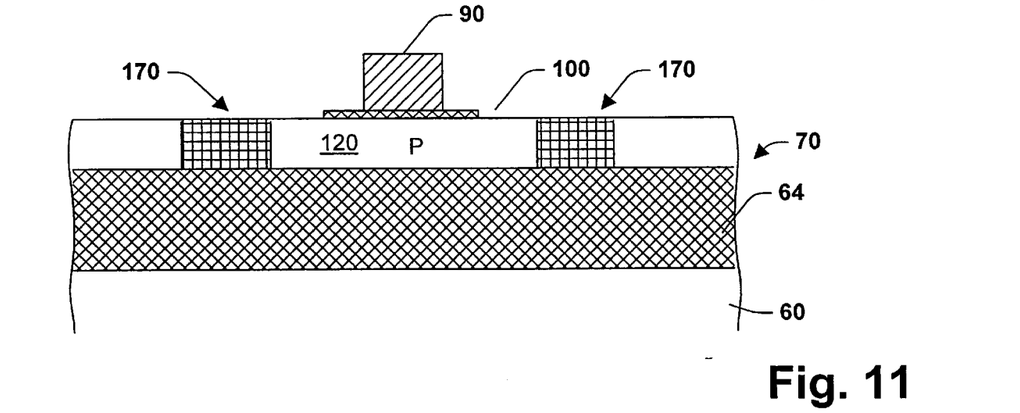
FIG. 11 is a schematic cross-sectional illustration of the structure of FIG. 10 after formation of a gate in accordance with the present invention.

Thereafter as shown in FIG. 11 the gate 90 is formed between the shallow trenches 170 over the thin gate oxide material 100. The gate 90 is made of polysilicon. The gate 90 has a thickness within the range of about 1000 to 2000 Å, and the thickness of the gate 90 is chosen so as to account for any subsequent polishing that might be performed. It will be appreciated of course that the thickness of the thin gate oxide material 100 and the gate 90 may be tailored as desired and the present invention intends to include any suitable range of thicknesses thereof for carrying out the present invention. Excess gate oxide material 100 is removed as is conventional.

Figure 12:
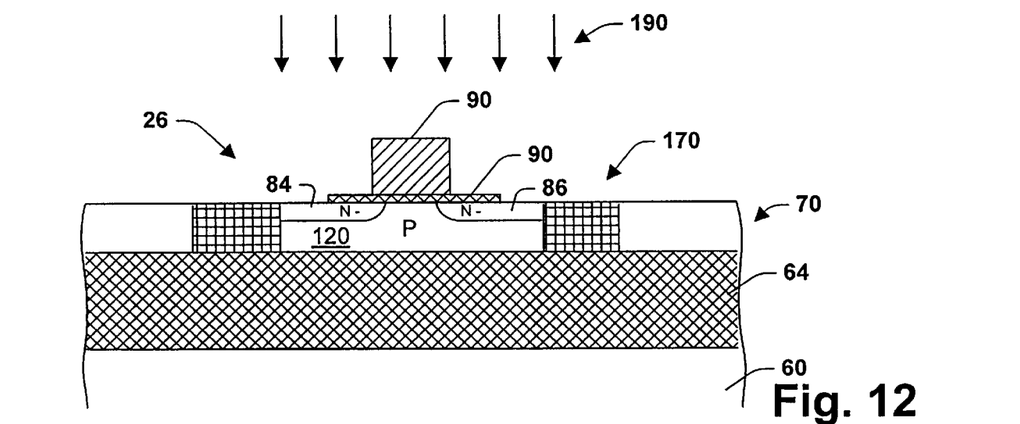
FIG. 12 is a schematic cross-sectional illustration of the structure of FIG. 11 undergoing an ion implant step to form first $N^-$ source/drain (S/D) lightly doped regions in accordance with the present invention.

FIG. 12 illustrates an n-region first ion implant step. An N⁻ implant 190 is used to form n-channel transistor lightly doped regions 84 and 86 which are self-aligned with the gate 90. In the preferred embodiment, this implant step may be an arsenic implant for example having a dose in the range of $1 \times 10^{14}$ to $1 \times 10^{16}$ atoms/cm² and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention.

Next, after the step of implanting arsenic, an optional nitrogen implant step may be performed as part of implant step 190. Nitrogen may be added via implantation in the lightly doped regions 84 and 86. The nitrogen implant may be applied at a dose of $1 \times 10^{14}$ to $5 \times 10^{15}$ atoms/cm² with an energy range of about 1 KeV to 100 KeV. It will be appreciated that although in the preferred embodiment the nitrogen implant step is performed after the arsenic implantation, the nitrogen implantation may be performed prior to the arsenic implantation.

The implantation of the nitrogen as represented results in reduced series resistance and hot carrier effects without significantly increasing S/D extension overlap. Contrary to conventional MOS fabrication techniques where increasing dopant concentration results in lower sheet resistance, the nitrogen implantation does not result in a deeper junction as a result of the increase in dopant. On the other hand, if the arsenic dopant dose is increased in order to lower sheet resistance, a deeper junction would result. The deeper junction may result in bad roll-off, make the MOS device more difficult to control, and possibly result in punch through effects. The implantation of nitrogen avoids these negative effects because the nitrogen does not increase the depth of the junction which is typically the case with conventional n-type dopants such as arsenic. However, unlike conventional techniques, the nitrogen implantation results in reduced series resistance. Thus, this step provides for reducing series resistance without the negative consequences (e.g., hot electron carrier and punch through effects) associated with conventional techniques.

Furthermore, the nitrogen implantation does not result in any significant increase in the amount of diffusion of the S/D extension into the gate. When an implant is provided in the S/D extension region the implant not only spreads vertically there is also horizontal spreading of the implant which is known as S/D extension overlap into the gate. The use of nitrogen implant does not result in any significant increase in S/D extension overlap as compared to conventional dopants.

Figure 13:
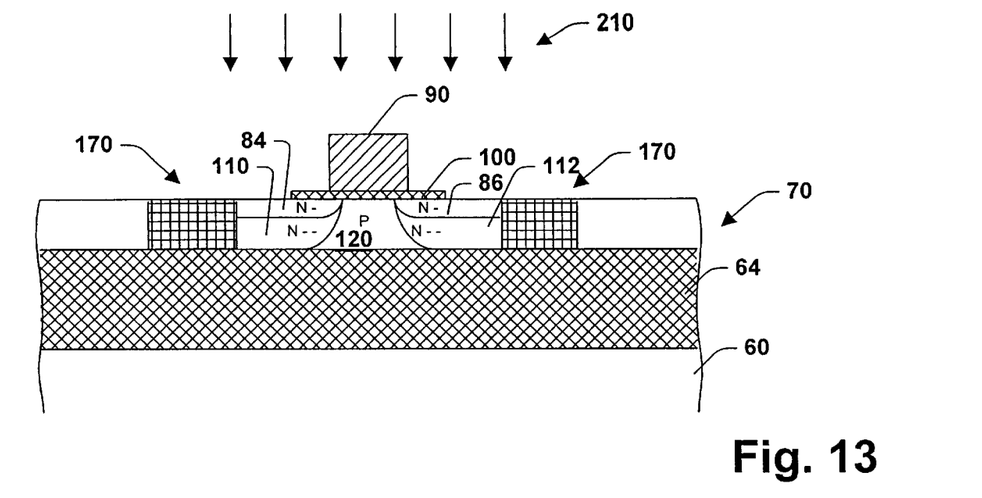
FIG. 13 is a schematic cross-sectional illustration of the structure of FIG. 12 undergoing a second implant step to form second very lightly doped $N^-$ source/drain regions in accordance with the present invention.

Turning now to FIG. 13, a second implant step 210 is performed to implant N⁻ implants at a lower dose but higher energy level than the N⁻ implant of step 190 to achieve the second very lightly doped regions 110, 112. The N⁻ implant step 210 will have a lower dopant concentration than that of N⁻ implant step 190. The N⁻ implant of step 210 is preferably phosphorus at a dopant concentration within the range of about $1 \times 10^{12} - 1 \times 10^{14}$ atoms/cm².

The lowest dopant concentration contemplated by the present invention is the dopant concentration which is just sufficient to compensate for the channel doping, which is typically about $3-7 \times 10^{17}$/cm³. Therefore the lower bound for the second implant step 210 doping concentration is the body dopant concentration (e.g., $3-7 \times 10^{17}$/cm³). It is understood, however, that as device geometries continue to shrink the body doping concentration continues to increase. Therefore any dopant concentration in the second very lightly doped regions 110, 112 which is sufficient to compensate for the channel doping is contemplated as the lower bound for the doping concentration for the second very lightly doped regions 110, 112.

As the doping concentration of the source/drain regions is decreased, although the junction capacitance decreases, the resistivity of the source/drain regions increase which can cause the transistor to slow down. It is believed that between source/drain dopant concentrations of $10^{17}$/cm³ and $10^{20}$/cm³, however, that an optimal point exists where the low junction capacitance best compensates for the increased source/drain resistance. The optional nitrogen implant step discussed above may be employed to mitigate increased resistivity.

Figure 14:
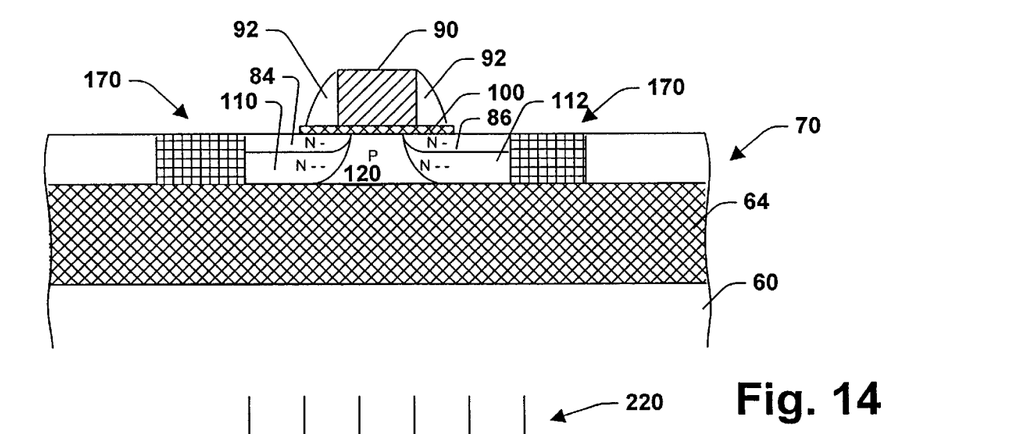
FIG. 14 is a schematic cross-sectional illustration of the structure of FIG. 13 after the formation of spacers in accordance with the present invention.

After the implant step 210, the spacers 92 are formed along sidewalls of the gate 90. To accomplish this step, a spacer material layer (not shown) may be formed over the top silicon layer 70. The spacer material layer may be formed by depositing tetraethoxysilane (TEOS) oxide, silicon dioxide or the like over the surface of the top silicon layer 70. The spacer material is then anisotropically etched to form the spacers 92 on the sidewalls of the gate 90, for example. An etchant which selectively etches the spacer material layer (e.g., etches the spacer material layer at a faster rate than the top silicon layer 70), may be used to etch the spacer material layer until only the spacers 92 remain at the sidewalls of the gate 90 as shown in FIG. 14.

Figure 15:
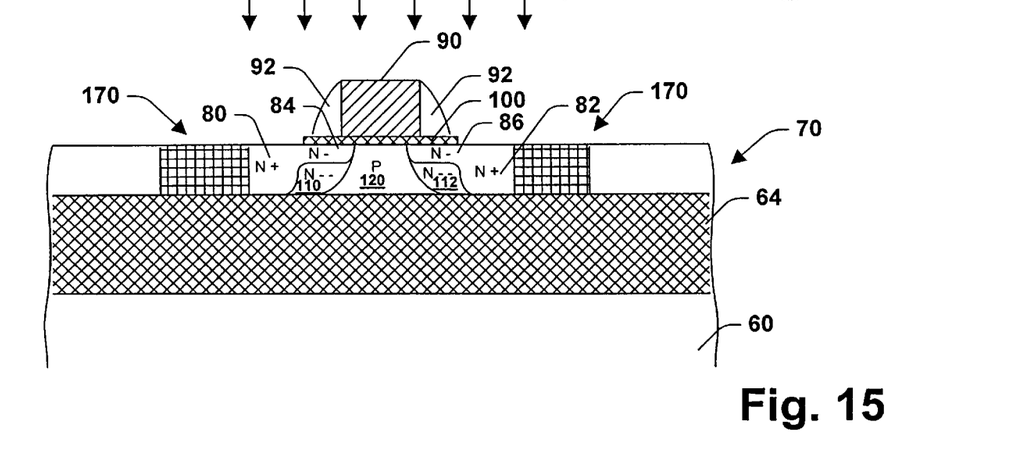
FIG. 15 is a schematic cross-sectional illustration of the structure of FIG. 14 undergoing an ion implant step to form source and drain regions in accordance with the present invention.

After the formation of the spacers 92 another ion implant step 220 is performed as shown in FIG. 15. An N⁺ implant is performed in step 220 to form N⁺ source region 80 and N⁺ drain region 82 in portions of the lightly doped regions, respectively. The spacers 92 serve as masks to prevent ion implantation in the portions of lightly doped regions underlying the spacers 92. These protected portions of the lightly doped regions are the respective lightly doped drain (LDD) region 84, lightly doped source (LDS) region 86 of the n-channel device 50, and second very lightly doped regions 110 and 112.

Figure 16:
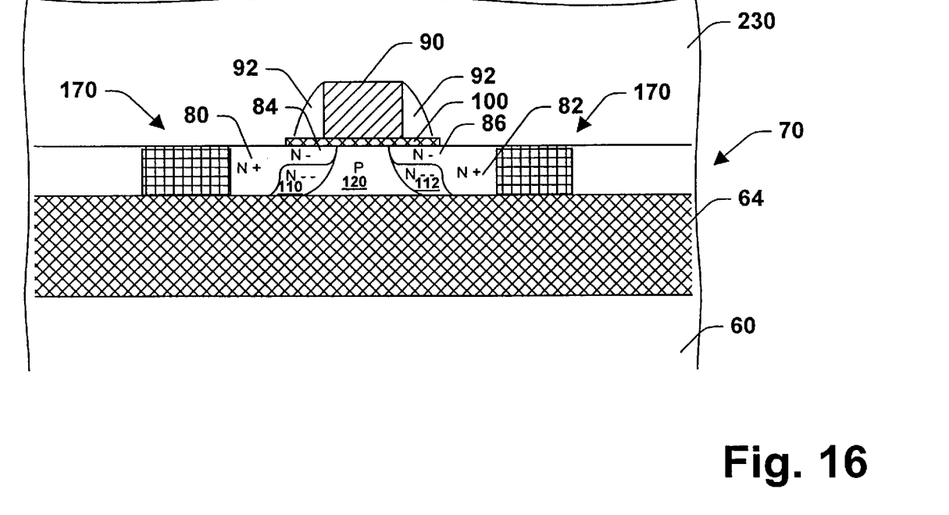
FIG. 16 is a schematic cross-sectional illustration of the structure of FIG. 15 after formation of an oxide layer over the structure in accordance with the present invention.
Figure 17:
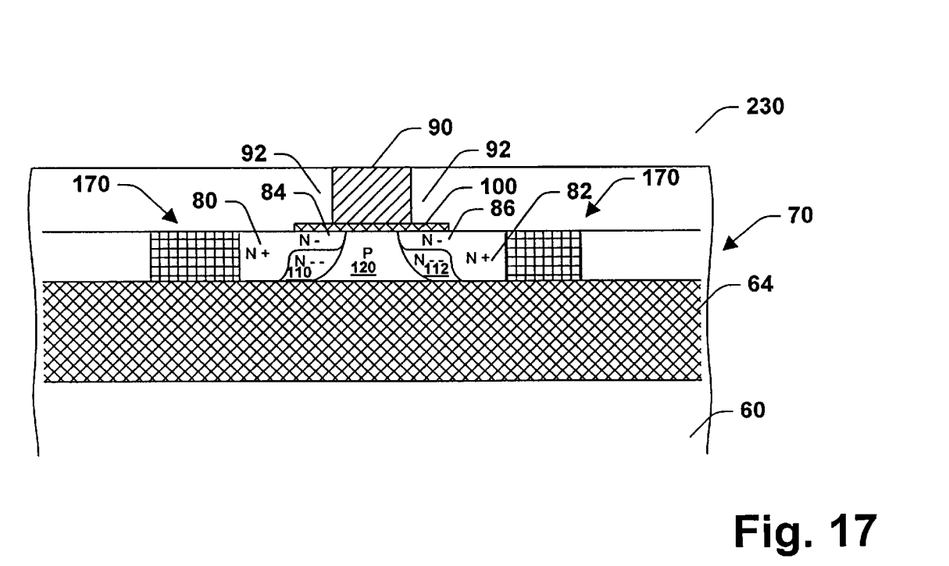
FIG. 17 is a schematic cross-sectional illustration of the structure of FIG. 16 after the oxide layer has been polished down to the surface level of the dummy gate in accordance with the present invention.

Turning now to FIG. 16, an oxide layer 230 is deposited over the MOSFET device 50. The oxide layer 230 is then polished via CMP down to the surface level of the gate 90 as shown in FIG. 17. The upper surface of the oxide layer 230 is thus substantially even with the upper surface of the gate 50. Consequently, the oxide layer 230 serves to mask the entire MOSFET device 50 except for the exposed gate 90. The spacers 92 are no longer depicted because they are of the same material as the oxide layer 230.

Thus, the MOSFET device 50 is complete in relevant part. It is to be appreciated that the substantially the same fabrication steps mentioned above are employed in the fabrication of the MOSFET device 140 of FIG. 1b. One difference in the fabrication steps is that an N⁻ implant step (to form the second very lightly doped regions 144, 146 is performed after formation of the sidewall spacers 150.

Substantially the same fabrication methodology may be employed in the fabrication of such an n-channel device as a bulk device as compared to the discussed SOI type device. One skilled in the art could readily tailor the above steps to form such n-channel devices based on the discussion herein, and therefore further discussion related thereto is omitted for sake of brevity.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a MOSFET device, comprising the steps of:

forming first lightly doped regions, the first lightly doped regions including LDD extension regions of the device; and forming second very lightly doped regions at least partially below the first lightly doped regions, respectively, the second very lightly doped regions having a dopant concentration less than the first lightly doped regions, and the second very lightly doped regions being implanted at a higher energy level than the first lightly doped regions, wherein the step of forming the second very lightly doped regions approaches intrinsic level doping.

2. The method of claim 1 further including the step of using at least one of As and P as the dopant for the first lightly doped regions.

3. The method of claim 1 further including the step of using at least one of As and P as the dopant for the second very lightly doped regions.

4. A method of forming a MOSFET device, comprising the steps of:

forming first lightly doped regions, the first lightly doped regions including LDD extension regions of the device; and forming second very lightly doped regions at least partially below the first lightly doped regions, respectively, the second very lightly doped regions having a dopant concentration less than the first lightly doped regions, and the second very lightly doped regions being implanted at a higher energy level than the first lightly doped regions, further including the step of using arsenic at a dopant concentration of about $1\times10^{14}$ to $1\times10^{16}$ atoms/cm$^2$ and implanted at an energy range of about 1 KeV to about 100 KeV in forming the first lightly doped regions, and using phosphorus at a dopant concentration of about $1\times10^{12}$ to $1\times10^{14}$ atoms/cm$^2$ and implanted at an energy level within the range of 50 KeV to about 200 KeV in forming the second very lightly doped regions.

5. The method of claim 1 further including the step of forming a p-type body region having a dopant concentration less than the dopant concentration of the second very lightly doped regions.

6. The method of claim 1, wherein the step of forming second very light doped regions is performed prior to a step of forming gate sidewall spacers.

7. A method of forming a MOSFET device, comprising the steps of:

forming first lightly doped regions, the first lightly doped regions including LDD extension regions of the device; and forming second very lightly doped regions at least partially below the first lightly doped regions, respectively, the second very lightly doped regions having a dopant concentration less than the first lightly doped regions, and the second very lightly doped regions being implanted at a higher energy level than the first lightly doped regions, wherein the step of forming second very light doped regions is performed after a step of forming gate sidewall spacers.

8. A method of forming an SOI NMOS transistor, comprising the steps of:

using a separation by implantation of oxygen (SIMOX) process to form a silicon base, an oxide layer between the base and a top silicon layer;

a silicon substrate;

an insulating oxide layer formed over the substrate;

forming N$^+$ source and N$^+$ drain regions in the top silicon layer;

forming N$^-$ lightly doped source and drain extension regions in the top silicon layer; and forming N$^-$ lightly doped source and drain regions, the N$^-$ regions having lower dopant concentration than the N$^-$ regions, respectively, the N$^-$ regions residing below at least portions of the N$^-$ regions, respectively; wherein the N$^-$ regions facilitate mitigating junction capacitance and mitigating floating body effects and short channel effects.

9. The method of claim 8 further including the step of using at least one of As and P as the dopant for the first lightly doped regions.

10. The method of claim 8 further including the step of using at least one of As and P as the dopant for the second very lightly doped regions.

11. The method of claim 8 further including the step of using arsenic at a dopant concentration of about $1\times10^{14}$ to $1\times10^{16}$ atoms/cm$^2$ and implanted at an energy range of about 1 KeV to about 100 KeV in forming the first lightly doped regions, and using phosphorus at a dopant concentration of about $1\times10^{12}$ to $1\times10^{14}$ atoms/cm$^2$ and implanted at an energy level within the range of 50 KeV to about 200 KeV in forming the second very lightly doped regions.

12. The method of claim 8 further including the step of forming a p-type body region having a dopant concentration less than the dopant concentration of the second very lightly doped regions.

13. The method of claim 8, wherein the step of forming N$^-$ lightly doped source and drain regions approaches intrinsic level doping.

14. The method of claim 8, wherein the step of forming N$^-$ lightly doped source and drain regions is preformed prior to a step of forming gate sidewall spacers.

15. The method of claim 1, wherein the step of forming N$^-$ lightly doped source and drain regions is performed after a step of forming gate sidewall spacers.

16. A method of forming a MOSFET device, comprising the steps of:

forming first lightly doped regions, the first lightly doped regions including LDD extension regions of the device, wherein at least one of Ar and P are used as the dopant for the first lightly doped regions; and forming second very lightly doped regions at least partially below the first lightly doped regions, respectively, the second very lightly doped regions having a dopant concentration less than the first lightly doped regions, and the second very lightly doped regions being implanted at a higher energy level than the first lightly doped regions, wherein at least one of As and P are used as the dopant for the second very lightly doped regions at a dopant concentration of about $1\times10^{12}$ to $1'10^{14}$ atoms/cm$^2$ and implanted at an energy level within the range of 50 KeV to about 200 KeV.

17. The method of claim 16, wherein the step of forming second very lightly doped regions approaches intrinsic level doping.

18. The method of claim 16, wherein the step of forming second very light doped regions is performed prior to a step of forming gate sidewall spacers.

19. The method of claim 16, wherein the step of forming second very light doped regions is performed after a step of forming gate sidewall spacers.

* * * * *

UNITED STATES PATENT AND TRADEMARK OFFICE
CERTIFICATE OF CORRECTION

PATENT NO. : 6,204,138 B1
DATED : March 20, 2001
INVENTOR(S) : Krishnan, et al.

It is certified that error appears in the above-identified patent and that said Letters Patent is hereby corrected as shown below:

Column 3,
Line 52, Please replace " an $N^-$ lightly " with -- an $N^{--}$ lightly --
Line 53, Please replace " the $N^-$ lightly " with -- the $N^{--}$ lightly --
Lines 58 and 62, Please replace " the $N^-$ drain " with -- the $N^{--}$ drain --

Column 4,
Line 5, Please replace " and $N^-$ lightly " with -- and $N^{--}$ lightly --
Line 6, Please replace " the $N^-$ regions " with -- the $N^{--}$ regions --
Line 8, Please replace " $N^-$ regions residing " with -- $N^{--}$ regions residing --
Line 9, Please replace " respectively. The" with -- respectively; wherein the --
Line 9, Please replace " $N^-$ regions " with -- $N^{--}$ regions --

Column 5,
Line 31, Please replace " doped $N^-$ source " with -- doped $N^{--}$ source --

Column 7,
Lines 45 and 62, Please replace " C. for " with -- C for --

Column 9,
Line 61, Please replace " $N^-$ implants " with -- $N^{--}$ implants --
Lines 63 and 65, Please replace " The $N^-$ implant " with -- The $N^{--}$ implant --

Claim 8,
Line 22, Please replace " forming $N^-$ lightly " with -- forming $N^{--}$ lightly --
Line 22, Please replace " the $N^-$ " with -- the $N^{--}$ --
Lines 24 and 26, Please replace " the $N^-$ regions " with -- the $N^{--}$ regions --

UNITED STATES PATENT AND TRADEMARK OFFICE
CERTIFICATE OF CORRECTION

PATENT NO. : 6,204,138 B1
DATED : March 20, 2001
INVENTOR(S) : Krishnan, et al.

It is certified that error appears in the above-identified patent and that said Letters Patent is hereby corrected as shown below:

Claim 13,
Line 48, Please replace " $N^-$ lightly " with -- $N^-$ lightly --

Claim 14,
Line 51, Please replace " $N^-$ lightly " with -- $N^-$ lightly --

Claim 15,
Line 54, Please replace " $N^-$ lightly " with -- $N^-$ lightly --

Signed and Sealed this

Twenty-second Day of January, 2002

Attest:

*Attesting Officer*

JAMES E. ROGAN
*Director of the United States Patent and Trademark Office*